United States Patent
Furse

(10) Patent No.: US 6,868,357 B2
(45) Date of Patent: Mar. 15, 2005

(54) FREQUENCY DOMAIN REFLECTOMETRY SYSTEM FOR TESTING WIRES AND CABLES UTILIZING IN-SITU CONNECTORS, PASSIVE CONNECTIVITY, CABLE FRAY DETECTION, AND LIVE WIRE TESTING

(76) Inventor: Cynthia M. Furse, 9400 Emigration Canyon, Salt Lake City, UT (US) 84108

( * ) Notice: Subject to any disclaimer, the term of this patent is extended or adjusted under 35 U.S.C. 154(b) by 0 days.

(21) Appl. No.: 10/190,314

(22) Filed: Jul. 5, 2002

(65) Prior Publication Data

US 2003/0125893 A1 Jul. 3, 2003

Related U.S. Application Data

(63) Continuation-in-part of application No. 10/043,884, filed on Jan. 9, 2002.
(60) Provisional application No. 60/303,676, filed on Jul. 7, 2001.

(51) Int. Cl.[7] ............................................. G01R 31/00
(52) U.S. Cl. ..................................... 702/108; 324/642
(58) Field of Search ............................... 324/637–638, 324/642, 534, 538–539, 541, 543–544; 702/57–59, 65, 108, 117, 124, 183, 185, 189, 81–84, 155, 158–159; 439/912

(56) References Cited

U.S. PATENT DOCUMENTS

| 5,068,614 A | * | 11/1991 | Fields et al. ................. 324/534 |
| 5,083,086 A | * | 1/1992 | Steiner ......................... 324/533 |
| 5,128,619 A | * | 7/1992 | Bjork et al. ................. 324/533 |
| 5,994,905 A | * | 11/1999 | Franchville .................. 324/533 |
| 6,011,399 A | * | 1/2000 | Matsumaru et al. ......... 324/538 |
| 6,016,464 A | * | 1/2000 | Richardson ................... 702/79 |
| 6,259,256 B1 | * | 7/2001 | Walling ....................... 324/539 |
| 6,324,168 B1 | * | 11/2001 | Richardson .................. 370/254 |

* cited by examiner

Primary Examiner—Marc S. Hoff
Assistant Examiner—Mary Catherine Baran
(74) Attorney, Agent, or Firm—Morriss O'Bryant Compagni, P.C.

(57) ABSTRACT

A frequency domain reflectometer that is in electrical communication with a cable under test in order to determine cable characteristics including cable length and load characteristics such as capacitance, inductance, resistance, impedance (which is characterized as an open or short circuit condition), and the location of an open or short circuit, wherein the FDR cable testing is performed in-situ when the system is installed at the time of installation of the cable to thereby enable testing of cable without having to remove it and risk damage, wherein FDR cable testing is performed passively so as not to interfere with normal operation of the cable even if the FDR cable testing system should fail, wherein a system is taught that can detect faults that are difficult to detect out of an operating environment, and wherein FDR cable testing is performed to detect cable fray conditions, wherein the cable may be grounded or coupled to air.

36 Claims, 15 Drawing Sheets

FREQUENCY DOMAIN REFLECTOMETRY SYSTEM FOR TESTING WIRES AND CABLES UTILIZING IN-SITU CONNECTORS, PASSIVE CONNECTIVITY, CABLE FRAY DETECTION, AND LIVE WIRE TESTING

CROSS REFERENCE TO RELATED APPLICATIONS

This document claims priority to U.S. Provisional Patent Application Ser. No. 60/303,676, filed on Jul. 7, 2001, and is a continuation-in-part of U.S. patent application Ser. No. 10/043,884, filed on Jan. 9, 2002.

BACKGROUND

1. The Field of the Invention

This invention relates generally to systems and techniques for performing wire and cable testing. More specifically, the invention teaches how to utilize the principles of frequency domain reflectometry (FDR) to perform wire and cable testing including determination of wire or cable characteristics such as length, impedance (which is characterized as an open or short circuit condition), the location of an open or short circuit, capacitance, inductance, and resistance, and wherein the frequency domain reflectometry is utilized to perform in-situ cable testing, testing utilizing passive connectivity, and testing for cable fray.

2. Background of the Invention

The benefits of being able to test cables and wires (hereinafter to be referred to as a cable or wire interchangeably) are many. Some reasons are obvious. For example, cables are used in many pieces of equipment that can have catastrophic results if the equipment fails. A good example of this is an airliner. However, the consequences of non-performance do not have to be so dire in order to see that benefits are still to be gained. For example, cables are used in many locations where they are difficult to reach, such as in the infrastructure of buildings and homes. Essentially, in many cases it is simply not practical to remove cable for testing, especially when this action can cause more damage than it prevents.

Given that the need for cable testing is important and in some cases imperative, the question is how to perform accurate testing that is practical, meaning relatively inexpensive and at a reasonable cost. The prior art describes various techniques for performing cable testing. One such technique is time domain reflectometry (TDR). TDR is performed by sending an electrical pulse down a cable, and then receiving a reflected pulse. By analyzing the reflected pulse, it is possible to determine cable length, impedance, and the location of open or short circuits.

One of the main disadvantages of TDR is that the equipment required to perform time analysis of a reflected signal is expensive and often bulky. These factors of cost and size can be critically important. A less costly and bulky system can be used in more places, more often, and can result in great savings in money spent on performing maintenance functions, and by replacing equipment before failure. But more importantly, the greatest benefit may be the saving of lives.

Consider again the airline industry. Miles of cabling inside an airplane is extremely difficult to reach and test. If the cabling is removed for testing, the cabling can be damaged where no damage existed before. Thus, testing can result in more harm than good when cabling must be moved to gain access. But the nature of cable carrying conduit in an airplane simply makes access with bulky testing equipment difficult. In addition, if the electronics for testing cables could remain in-situ, then testing could be automated and used routinely before or after flight, or at any other time that testing was requested. This can be accomplished only with smaller, less expensive testing systems such as can be provided by frequency domain reflectometry.

It is noted that TDR is not the only prior art technique available for cable testing. In standing wave reflectometry (SWR), a signal is transmitted and a reflected signal is received at a directional coupler. The system then measures the magnitude of the reflected signal. A short circuit, an open circuit, and the depth of a null gives the same information as TDR. However, this technique is generally less accurate and nearly as expensive as TDR.

It is worth noting that the prior art sometimes refers to an FDR cable testing system. However, upon closer inspection, the system being described is actually an SWR cable testing system.

The FDR system to be described in this document is capable of very specific determination of cable characteristics. These characteristics include length, impedance (which is characterized as an open or short circuit condition), the location of an open or short circuit, capacitance, inductance, and resistance. However, it would be advantageous to be able to determine these cable characteristics in very specific circumstances, in situations where the testing of the cable must not interfere with operation of a circuit, regardless of the integrity of the testing apparatus, and to be able to determine these characteristics in circumstances that make it difficult to detect a cable fault because of the nature of the fault.

Accordingly, it would be an advantage over the prior art to utilize FDR to perform in-situ testing of cables in cables that can be modified at a connector, to provide "smart wire" capabilities where the FDR cable testing circuits are disposed in the cabling itself, and to perform these tests on a live cable, or one having no signal or power applied.

It would be another advantage over the prior art to provide the FDR cable testing system that operated in a passive mode, such that no interruption in operation of the cable occurred, even if the testing system were to fail.

It would be another advantage over the prior art to utilize the FDR cable testing system that would enable detection of faults that are more difficult to detect than simple open and short circuits, namely cable fraying, wherein the fray may be shorted to ground or open to air.

It would be another advantage to provide a system that would be less costly because of the nature of the FDR cable testing components utilized therein. It would be another advantage to provide a system that is more likely to be used because it is not as difficult to operate as the prior art cable testing equipment, and can be automated in some situations for regular testing even by unskilled personnel.

It is worth noting that the technology being applied to the problem of cable testing by the present invention has not previously been used for this purpose. Specifically, frequency domain reflectometry (FDR) is typically used in radar applications. FDR is based on single frequency radar or stepped frequency radar. It was utilized in a free-space environment where antennas are used to transmit and receive a radar signal. Thus, the results produced when used for cable testing were surprising to those skilled in the art.

SUMMARY OF INVENTION

It is an object of the present invention to provide a system for cable testing that utilizes the principles of frequency domain reflectometry (FDR).

It is another object to provide an FDR cable testing system that is less costly than prior art cable testing equipment.

It is another object to provide an FDR cable testing system that is less bulky than prior art cable testing equipment.

It is another object to provide an FDR cable testing system that utilizes less power than prior art cable testing equipment.

It is another object to provide an FDR cable testing system that is disposed in-situ in order to provide cable testing where it is otherwise difficult or dangerous to remove cables for testing.

It is another object to provide an FDR cable testing system that is capable of providing passive cable testing without interrupting a continuous connection of the cable being tested.

It is another object to provide an FDR cable testing system that is capable of detecting cable fray that is grounded or coupled to air.

In a preferred embodiment, the present invention is a frequency domain reflectometer that is in electrical communication with a cable under test in order to determine cable characteristics including cable length and load characteristics such as capacitance, inductance, resistance, impedance (which is characterized as an open or short circuit condition), and the location of an open or short circuit, wherein the FDR cable testing is performed in-situ when the system is installed at the time of installation of the cable to thereby enable testing of cable without having to remove it and risk damage, wherein FDR cable testing is performed passively so as not to interfere with normal operation of the cable even if the FDR cable testing system should fail, wherein a system is taught that can detect faults that are difficult to detect out of an operating environment, and wherein FDR cable testing is performed to detect cable fray conditions, wherein the cable may be grounded or coupled to air.

In a first aspect of the invention, a set of sine waves is transmitted, and a reflected signal is combined with the transmitted signal and analyzed to determine cable characteristics.

In a second aspect of the invention, the electronic circuitry can be disposed within a single integrated circuit.

In a third aspect of the invention, the FDR cable testing system provides at least the same level of accuracy as the prior art cable testing systems.

In a fourth aspect of the invention, the FDR cable testing system provides in-situ deployment that is disposed on a cable connector.

In a fifth aspect of the invention, the FDR cable testing system is disposed within cable insulation itself.

In a sixth aspect of the invention, the FDR cable testing system is coupled to a cable in a passive manner, thereby not affecting cable operation even if the FDR cable testing system should fail.

In a seventh aspect of the invention, the FDR cable testing system is utilized to detect cable fray if sufficient energy is provided in order to overcome all of the lost reflected energy.

In an eighth aspect of the invention, it is shown how spread spectrum technology can be used to discover ticking faults on live cables.

These and other objects, features, advantages and alternative aspects of the present invention will become apparent to those skilled in the art from a consideration of the following detailed description taken in combination with the accompanying drawings.

DETAILED DESCRIPTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

In the most basic principles of FDR, a set of sine waves is transmitted in a cable, and a reflected signal is then analyzed. One of the main advantages of FDR over TDR is that an FDR system only requires five distinct electronic components, and these components are relatively inexpensive. In contrast, a TDR system is approximately the size of a cigar box, and its components can cost approximately $1500. Thus, whereas the present invention can be disposed within a single integrated circuit, the TDR system is much larger. In addition, the cable testing system utilizing FDR requires much less power than the TDR system, and the cost is around $20 for the FDR system circuitry.

While FDR, TDR and SWR systems are known in the prior art, utilizing an FDR system to test cables is a novel application of the technology, and the results are unexpected.

Figure 1:
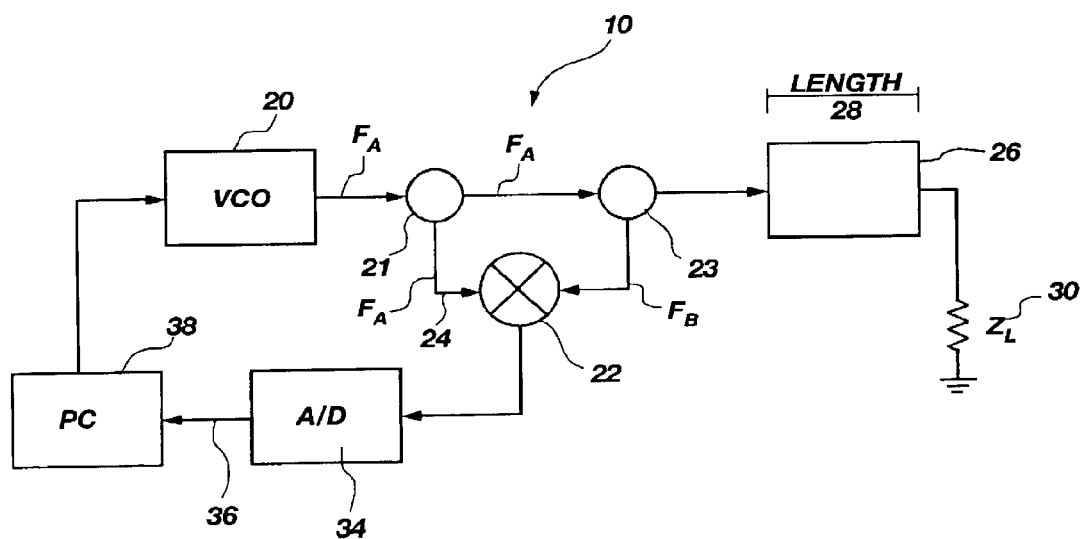
FIG. 1 is a schematic block diagram illustrating an embodiment of a frequency domain reflectometry (FDR) cable testing system that is made in accordance with the principles of the present invention.

The FDR cable testing system 10 of the present invention is shown in FIG. 1. A sine wave generator such as a voltage controlled oscillator (VCO) 20 generates an input signal $F_A$ in the form of sine waves. The VCO 20 feeds the input signal $F_A$ down two different paths. The first path of the input signal $F_A$ is into a directional coupler 21. From there, the input signal goes to a mixer 22 as a test or reference signal 24. The second path for the input signal $F_A$ is into a device under test or cable under test (CUT) 26. The CUT 26 will have some characteristic load $Z_L$ 30.

While the FDR cable testing system 10 was initially designed by the inventors to detect opens and shorts in a cable, the system can also detect inductive and capacitive impedances. Thus, the characteristics of the CUT 26 that are of most interest to the present invention's function as a cable testing system are of the length 28 and of the load 30. It should be recognized that the load 30 of the CUT 26 can be complex.

When the input signal $F_A$ is generated by the VCO 20, the input signal $F_A$ is reflect at the load 30, and is passed back along the CUT 26. The reflected signal $F_B$ is split from the CUT 26 using directional coupler 23 and is then received by the mixer 22. A combined output signal 32 is then read from the mixer 22 and sent to an analog to digital (A/D) converter 34. Because a mixer is a frequency multiplier, the combined output signal 32 of the mixer 22 has three components: the input signal $F_A$, along with $F_A+F_B$, and $F_A-F_B$. It should be apparent that the components $F_A$ and $F_A+F_B$ are going to be high frequency signals, but $F_A-F_B$ is not. Because $F_A=F_B$, it is a DC signal.

The A/D converter 34 thus automatically filters out the high frequency components $F_A$ and $F_A+F_B$ of the combined signal 32, leaving only the desired DC component $F_A-F_B$, which has a magnitude related to the electrical length of the CUT 26 and the load 30. The resulting signal 36 is then sent to a processor 38 such as a microcontroller or other processing system. The processor 38 must perform Fast Fourier Transform (FFT) calculations and some algebraic calculations to obtain the desired information. The function of the FFT calculations is to determine the number of cycles as a function of frequency in the digital signal generated by the A/D converter 34. The specific algebraic calculations will be shown in relation to an explanation of FIG. 2.

There are various methods that can be used to determine the number of cycles above. The FFT is a convenient system, and all of these methods are known to those skilled in the art. These methods include the Discrete Fourier Transform, the Two Equations—Two Unknowns method, N-Equations N-Unknowns, Interpolation and FFT, Interspersing Zero Points and Low Pass Filtering, Acceleration of Data Signal, Zero Crossing of Signals, and finally Mathematical Modeling.

Any of these methods can be substituted for FFT without changing the essence of the invention. These other methods are also known to those skilled in the art, and are not considered a limitation of the invention. The FFT method is simply offered in more detail in order to provide a working example.

The processor 38 generally serves another useful function other than performing the calculations that obtain the desired results. Specifically, it is desirable to use the processor 38 to control operation of the VCO 20. This is because the processor 38 can also be made capable of stepping the VCO 20 through various sets of frequencies in order to determine all of the desired characteristics of the CUT 26. In other words, several frequencies in several different frequency bands could be analyzed using this method.

The implications of the simple circuit used in the FDR cable testing system 10 as described in FIG. 1 should not be overlooked. The FDR cable testing system 10 is capable of providing data regarding loads thereon, including open circuits, short circuits, capacitance, inductance, resistance, some very large chafes, frays, and other anomalies. As implemented, the FDR cable testing system also provides the length of the CUT 26 within approximately 3 to 7 centimeters. However, it is envisioned that this range can be controlled (reduced or increased) by varying the range and resolution of the frequencies used.

Figure 2:
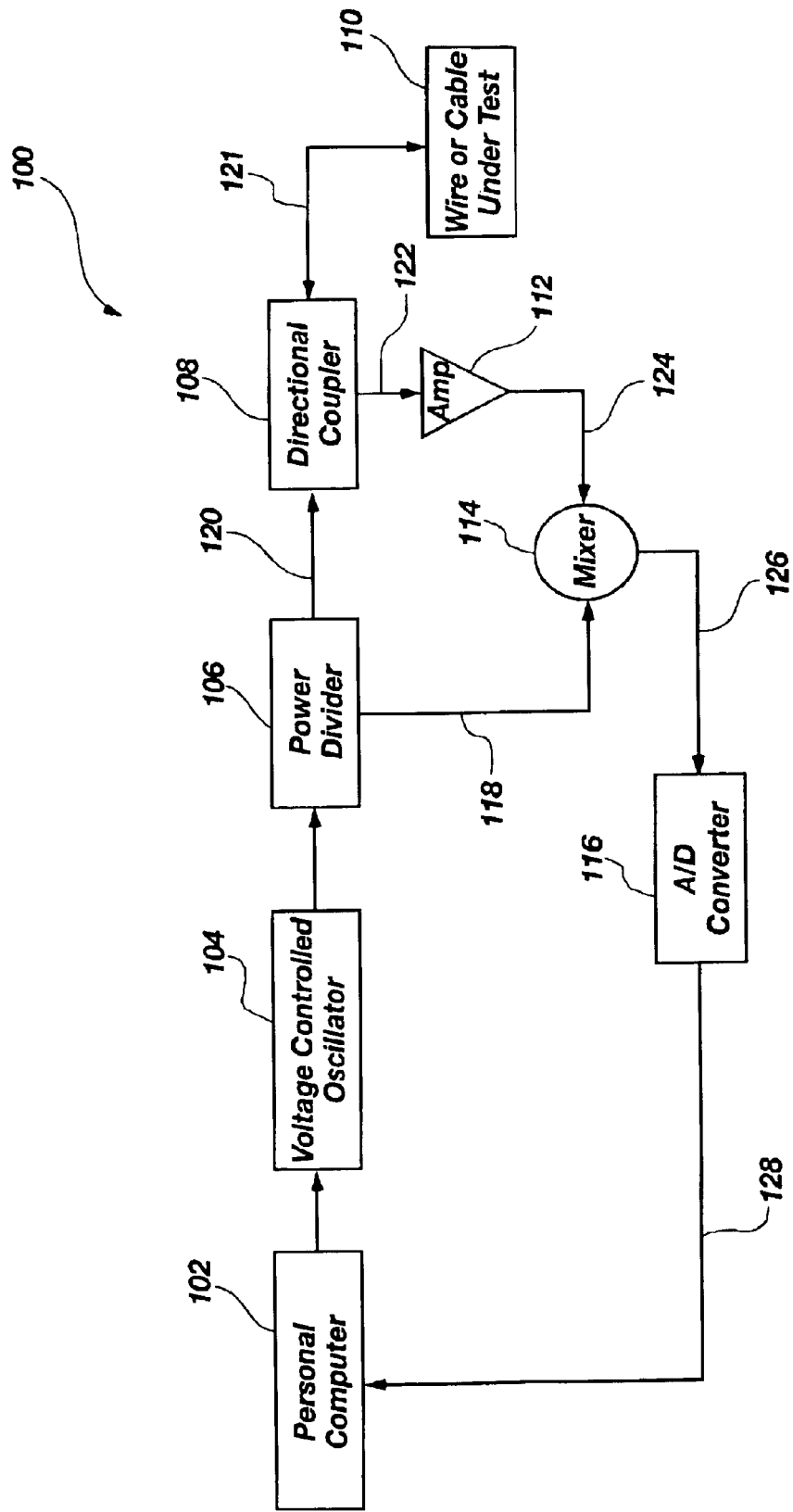
FIG. 2 is an alternative embodiment of the FDR cable testing system and illustrated in the form of a schematic block diagram.

FIG. 2 is an illustration of FDR cable testing system 100 providing additional detail not shown on the basic circuitry shown in FIG. 1. FIG. 1 shows that a personal computer 102 is performing the functions of controlling the generation of an input signal, as well as the function of calculating the desired information regarding a cable under test. The personal computer 102 is coupled to a sine wave generator such as the voltage-controlled oscillator 104. The VCO 104 receives a control signal in the form of an analog voltage from the personal computer 102, and generates at least one sine wave that is transmitted to the power divider 106 as an input signal. The power divider 106 in this embodiment is a 3 dB power divider. However, a 20 dB power divider or other value could be used. The power divider 106 is configured to split the input signal along two separate transmission paths 118 and 120. A mixer 114 receives the input signal transmitted along transmission path 118. The cable under test 110 receives the input signal transmitted along transmission path 120, through the directional coupler 108 and path 121.

The input signal traveling down the CUT 110 continues until a point of termination of the CUT 110 is reached. Termination of the CUT 110 is generally going to be either an open circuit or a short circuit condition, although less extreme terminations can also be evaluated.

When the input signal encounters a termination of the CUT 110, the input signal is reflected. The reflected input signal is transmitted to a directional coupler 108, and then to an amplifier 112 along transmission path 122. The reflected input signal is amplified in this embodiment so that it approximately matches the magnitude of the input signal that was transmitted to the mixer 114. After the reflected input signal has been amplified, it is also sent to the mixer 114 along transmission path 124.

It should be explained that the amplifier is optional. When the CUT 110 is long, the reflected input signal may be relatively weak when compared to the input signal. Thus, it can be beneficial to amplify it. But amplification may not be necessary.

The mixer 114 receives two signals, the input signal from the VCO 104, and the reflected input signal from the CUT 110, all of which are at the same frequency. A mixer output signal is comprised of three components: the original input signal, the sum of the input signal and the reflected input signal, and the difference between the input signal and the reflected input signal. The mixer output signal is transmitted to an A/D converter 116 along transmission path 126. The A/D converter 116 is effectively a low pass filter. The input signal and the sum of the input signal and the reflected input signal are filtered out. But the difference between the input signal and the reflected input signal is a DC voltage value, which is converted by the A/D converter 116.

After conversion of the analog mixer output signal to a digital signal, the digital signal is sent to the personal computer 102 along transmission path 128. Analysis of the digital signal received by the personal computer 102 is performed to determine a termination point of the CUT 110 in accordance with characteristics of the digital signal.

Figure 3:
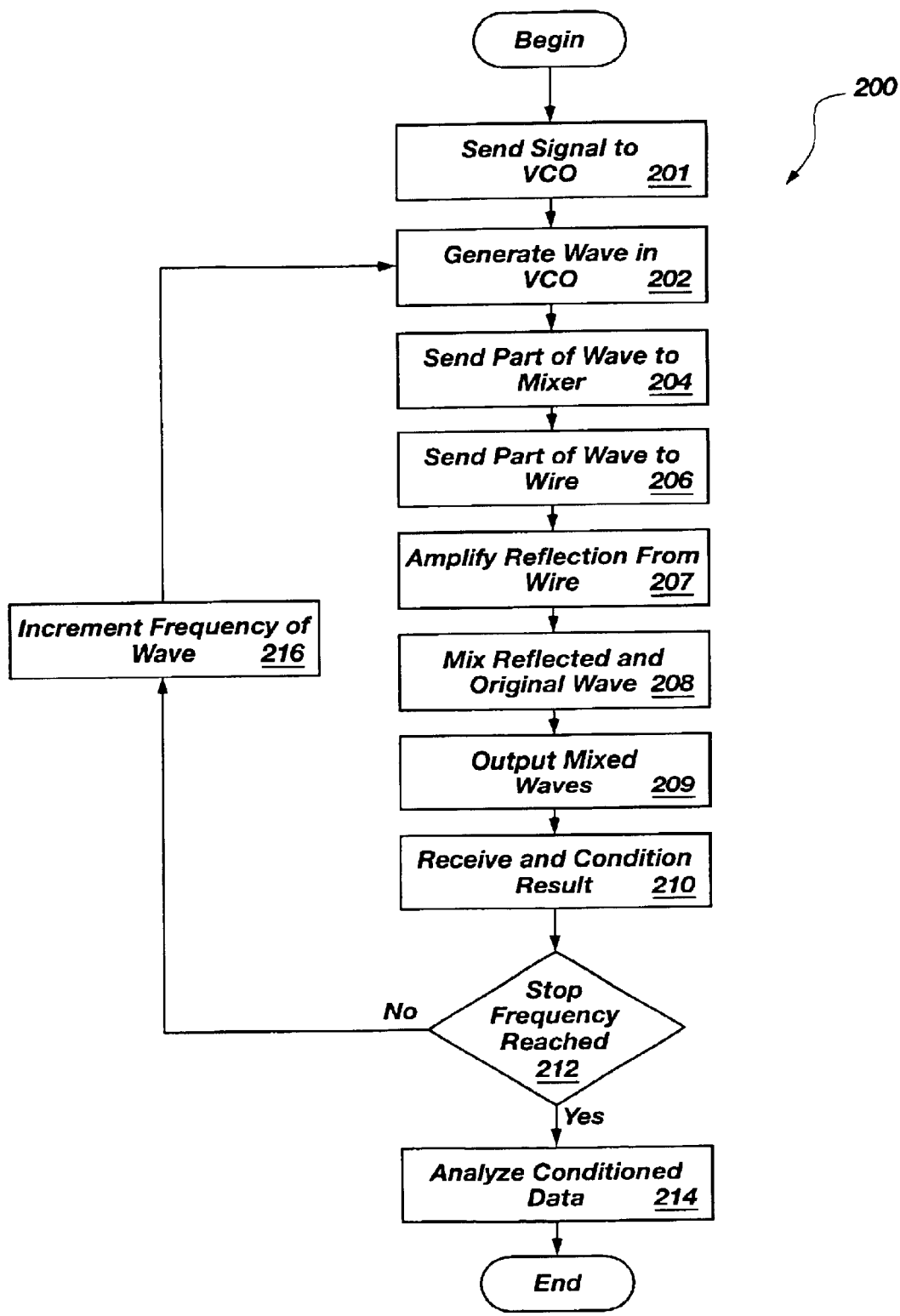
FIG. 3 is a flowchart illustrating one embodiment of a method of utilizing the FDR cable testing system as described in FIG. 1.

FIG. 3 is a flowchart that helps to describe the flow of the process performed by the FDR cable testing system described in FIG. 2. The method 200 begins with step 201 by transmitting a command signal from the personal computer 102 to the VCO 104 indicating the frequency of the sine wave to be generated by the VCO. The command signal transmitted in step 201 is received by the VCO 104 which then generates the sine wave of the required frequency in step 202. A power divider 106 then divides the sine wave generated in step 202 so that it is sent to both the mixer 114 in step 204 and to the CUT 110 in step 206.

The input signal travels down the CUT 110 until it encounters either the open circuit or the short circuit and is reflected from the open or short circuit. The reflected input signal is then amplified by the optional amplifier 112 in step 207 and sent to the mixer 114. In step 208, the mixer 114 combines the original input signal and the reflected input signal. In step 210, the mixed signals are received by the A/D converter 116 and conditioned. The method of FIG. 3 is now interrupted in order to review the conditioning process 210 in more detail in FIG. 4.

Figure 4:
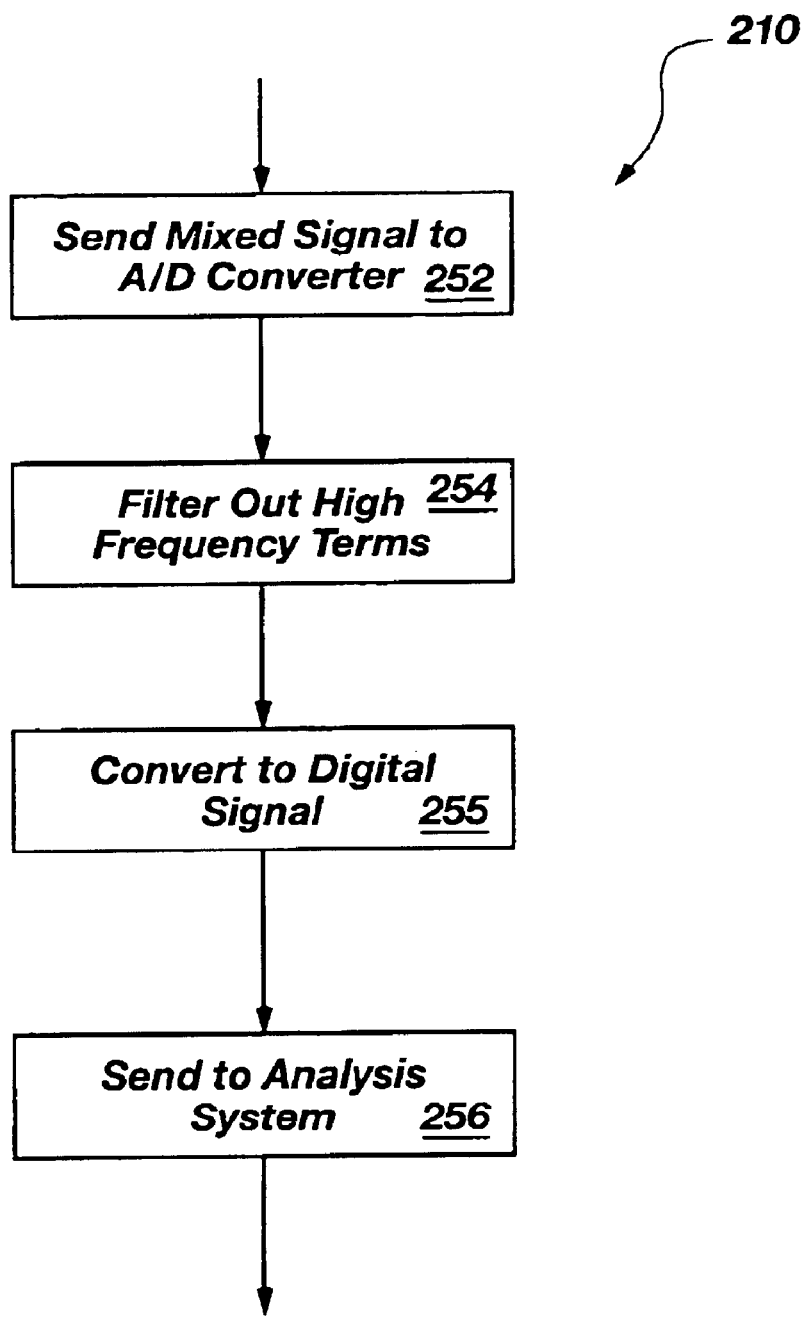
FIG. 4 is flowchart illustrating an embodiment of a method for conditioning a signal received from the FDR cable testing system as described in FIG. 1.

FIG. 4 shows that the output of the mixer 114 is actually three mixed signals. The mixed signals are the original input signal, the sum of the input signal and the reflected input signal, and the difference of the input signal and the reflected input signal. These three mixed signals are sent to the A/D converter 116 in step 252. The A/D converter 116 filters out the high frequency components of the three mixed signals in step 254. The results of this are that the input signal and the sum of the input signal and the reflected input signal are dropped. The remaining DC signal, which is the difference between the input signal and the reflected input signal, is converted to a digital voltage (referred to as a digital signal hereinafter) in step 255. The digital signal is transmitted to the personal computer 102 in step 256.

The digital signal which is the difference between the input signal and the reflected input signal is a DC signal having a voltage that is dependent upon the frequency of the original input signal, the length of the CUT 110, and the point of termination of the CUT 110.

Returning now to FIG. 3, the method 200 next determines if a predetermined stop frequency has been reached in step 214. A stop frequency is whatever frequency that has been determined that the VCO 104 will not go beyond when generating the input signal, or in other words, the frequency of the sine wave. If the predetermined stop frequency has not been reached, the frequency of the sine wave to be transmitted as the new input signal is incremented in step 216, also according to a predetermined step frequency value that is recorded in the personal computer 102. The personal computer 102 sends a new frequency for the input signal to be generated by the VCO 104, and the method 200 begins again at step 202 until the predetermined stop frequency is reached.

In one preferred embodiment, a starting frequency that is transmitted from the personal computer 102 to the VCO 104 is 800 MHz, a stop frequency is 1.2 GHz, and a step frequency, by which the input signal will be incremented through each iterative run through the method 200 until reaching the stop frequency, is 10 MHz. As indicated in step 214, the personal computer analyzes the data to determine characteristics of the CUT 110. The values given above may change so should not be considered limiting, but they are provided as one possible set of frequency values that can work for many cables.

It is noted that other frequency bands have been used, beginning at 200, 300 and 400 MHz. Experimentation is proceeding with 50 MHz frequency bands. Lower frequency bands do provide benefits to the system.

Figure 5:
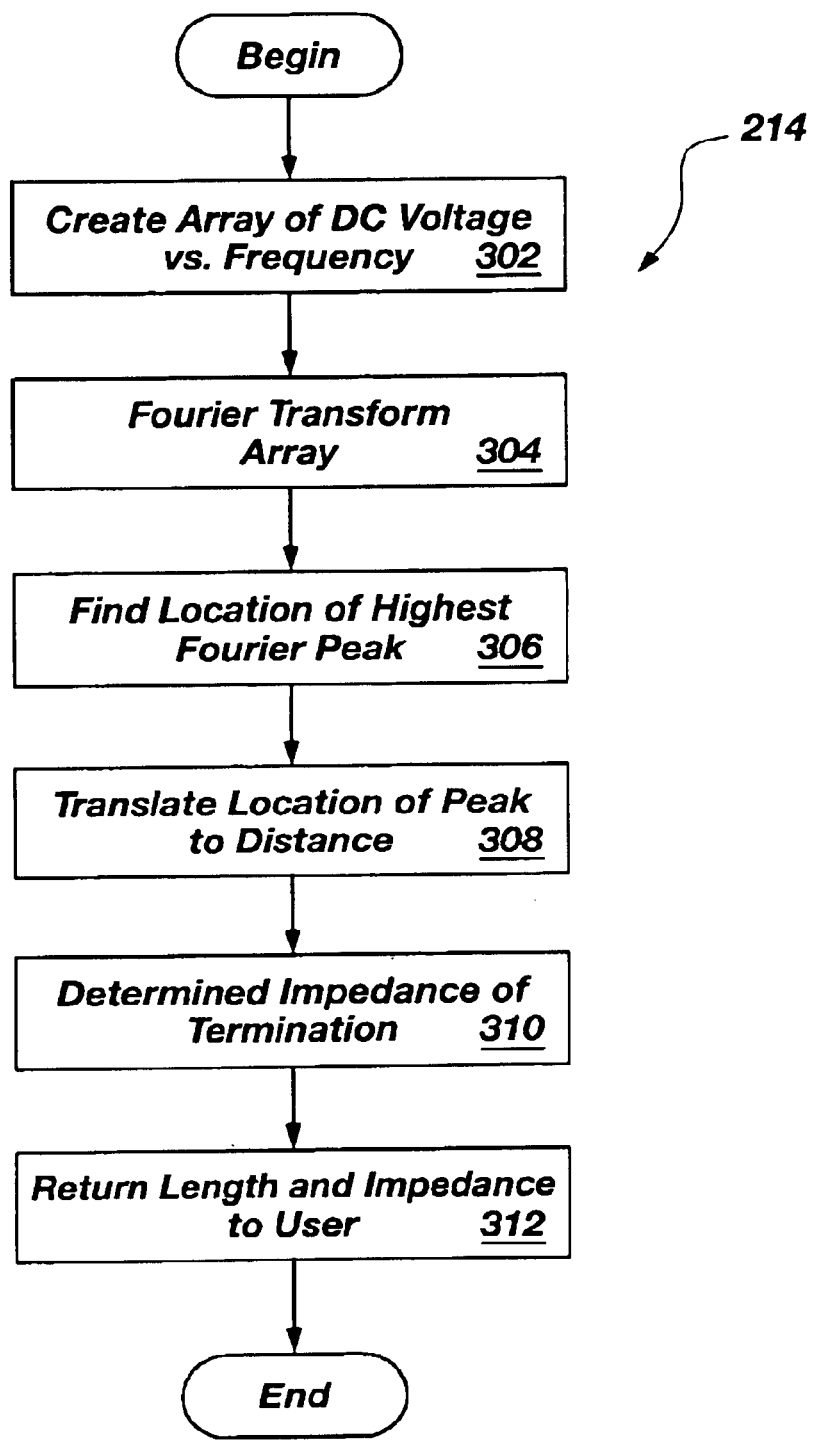
FIG. 5 is a flowchart illustrating an embodiment of a method for processing data received from the FDR cable testing system as described in FIG. 1.

FIG. 5 is a flowchart of a method 300 of analyzing the digital signal received by the personal computer 102 from the A/D converter 116 in FIG. 2. The A/D converter 116 will send a plurality of digital signals to the personal computer 102, one digital signal for each of the frequencies used as input signals by the VCO 104. In step 302, the plurality of digital signals are stored in a memory array in the personal computer 102. Once the FDR cable testing system 100 has completed stepping through a desired range of frequencies, the stored data is processed in step 304.

In one embodiment, the step of processing begins by indexing the array by frequency of the input signal vs. the DC response at that frequency. This indexing creates a table of the DC response of the CUT 110 at all of the stepped input frequencies. The array created in step 302 is then transformed using the Fast Fourier Transform (FFT) by the personal computer 102 in step 304.

The FFT of the array in step 304 creates a Fourier signal having a given magnitude. The location of the peak of the Fourier signal having the greatest magnitude is then determined in step 306. The location of the highest peak is then translated to a distance along the CUT 110 where the point of termination occurred. In so doing, the location of the termination of the CUT 110 is given by equation 1, where L is the length of the cable to the point of termination, u is the velocity of propagation of the wave in the cable, wherein N is the number of cycles of the digital signal as a function of frequency, and $f_{BW}$ is the bandwidth in Hertz of the sampling range.

Equation 1:
$$L = \frac{uN}{2f_{BW}}$$

Once the location of the point of termination has been determined in step 308, the nature of the point of termination can be determined in step 310. This is found by determining the impedance of the point of termination. A small impedance indicates a short circuit, while a large impedance indicates an open circuit. In order to calculate impedance at the point of termination, equations 2 and 3 are utilized.

Equation 2:
$$Z_{in} = \frac{Z_0(p+1)}{(p-1)}$$

Equation 3:
$$Z_L = \frac{Z_0(Z_{in} - jZ_0 \tan\beta l)}{(Z_0 - jZ_{in} \tan\beta l)}$$

In equations 2 and 3, $Z_{in}$ is the input impedance of the system, p is the complex reflection coefficient of the CUT 110, $Z_0$ is the impedance at the point of termination of the CUT 110, and l is the length of the CUT 110 as found in step 308. By solving equation 2 for $Z_{in}$ and then solving equation 3 for $Z_L$ the impedance of the termination of the CUT 110 may be determined. The length of the CUT 110 and the impedance at the point of termination of the wire are then returned to the user in step 312.

One advantage of the embodiments of the present invention is that the FDR cable testing systems are portable. In other words, the cable testing may be performed using an ordinary laptop or notebook computer as the personal computer 102, and thus taken on-site to conduct cable testing. The flexibility of the system becomes quite clear after realizing that an aircraft does not have to be returned to a hangar, but can be analyzed wherever it is located.

When the personal computer 102 is replaced by a microprocessor, the cable testing system becomes a compact in situ device.

It is also mentioned that integrity of a cable can be determined by comparing results when the cable is known or assumed to be good, and results taken afterwards.

The specification above has concerned itself exclusively with the most basic concepts of the invention regarding the use of FDR for cable testing systems. However, given the FDR cable testing system of the present invention, it is another aspect of the present invention to show how it can be disposed in cables in a manner that makes it highly advantageous to use.

Specifically, consider a cable that is installed in a large aircraft, such as a large commercial airliner. There are miles of cabling within such an aircraft. Much of the cabling is hidden behind panels, bulkheads, and cable conduit, and is otherwise virtually inaccessible without dismantling much of the aircraft. Furthermore, there are many large structures that suffer from the same problem, such as large buildings, ships, etc.

Another problem specific to the flight industry is that aircraft are being flown far past their intended lifetime. Often these aircraft are serviced by being taken completely apart. At this time, the cabling could be retrofitted to include the present invention in a manner that will be described.

It is noted that these wires in aircraft are especially subject to severe conditions of varying temperature, enormous amounts of vibration, and human handling problems from maintenance personnel. These conditions cause the insulation of the wire to crack, chafe or fray, and thereby expose the bare wire inside. These abrasions to the insulation can range from hairline cracks to exposed areas of the wire. This represents a dangerous situation to the aircraft when these wires are near flammable materials, and could possibly short to ground, creating a spark from the exposed wire that can ignite surrounding materials with catastrophic results.

The present invention teaches an FDR cable testing system that can be disposed in-situ. The system would remain in the cabling for the life of the aircraft, enabling testing at will. However, an in-situ testing system is only going to be useful if it can deliver its data regarding cable integrity to some remote location. Thus, the present invention envisions an in-situ FDR cable testing system that also includes the ability to transmit data, either by wire, or wireless transmission means.

One of the greatest advantages of the in-situ FDR cable testing system is that because the system is always in place, it can be merely the task of pressing a button to perform FDR cable testing throughout a large structure where the in-situ connectors are located.

An in-situ FDR cable testing system is generally going to be disposed at connector junctions because it is a relatively simple matter to connect the testing apparatus to the cabling by placing it between a cable and a junction box, or between two cables that are being joined together.

Figure 6:
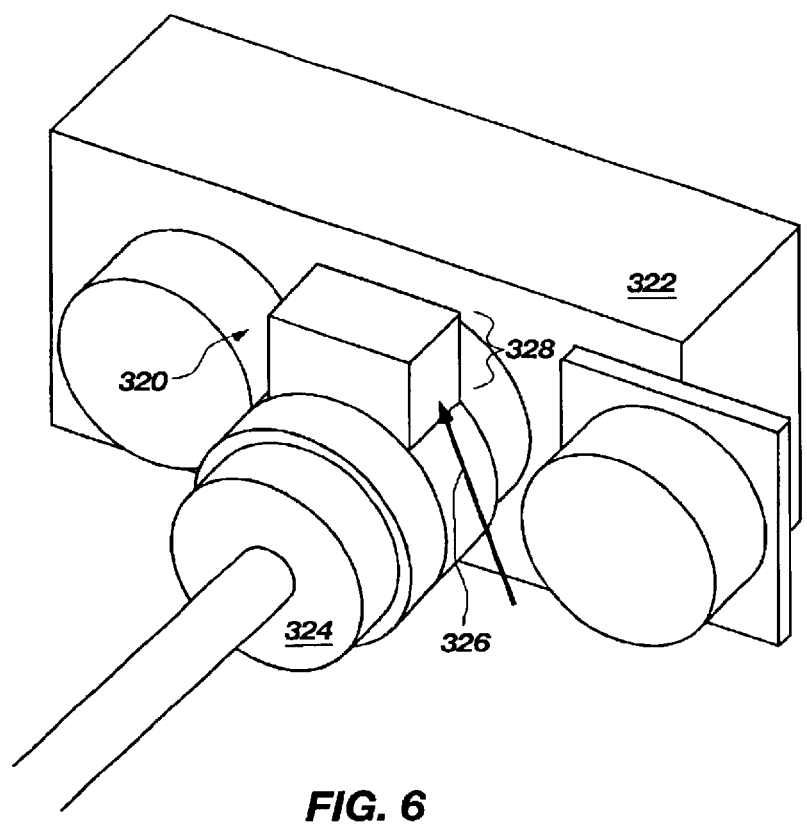
FIG. 6 is a first embodiment of an in-situ FDR cable testing system.

Advantageously, the exact form of an in-situ FDR cable testing system can be varied. In other words, the system can be implemented in more than one type of connector. For example, consider FIG. 6 which is a perspective illustration of an in-situ FDR cable testing system 320. The in-situ FDR cable testing system 320 includes what may be referred to as a "smart connector" 326, which in this illustration is shown disposed between cable 324 and a junction box 322. Electronic circuitry of the FDR cable testing system 320 is housed within a unit 328 disposed on the smart connector 326.

Power for operating the in-situ FDR cable testing system 320 could be drawn, for example, from nearby cables, or even from a power line among the cables being tested. Very little power would be needed to function, and it would only be drawn when the in-situ FDR cable testing system 320 was activated for testing.

One of the reasons that the in-situ FDR cable testing system 320 is disposed at a junction box 322 is because of concerns for the size of the system. There is not likely to be much space within the confines of cable conduit where most wiring is being disposed. Thus, it is important that the in-situ FDR cable testing system 320 be capable of being disposed in spaces where there is going to be sufficient room.

Figure 7:
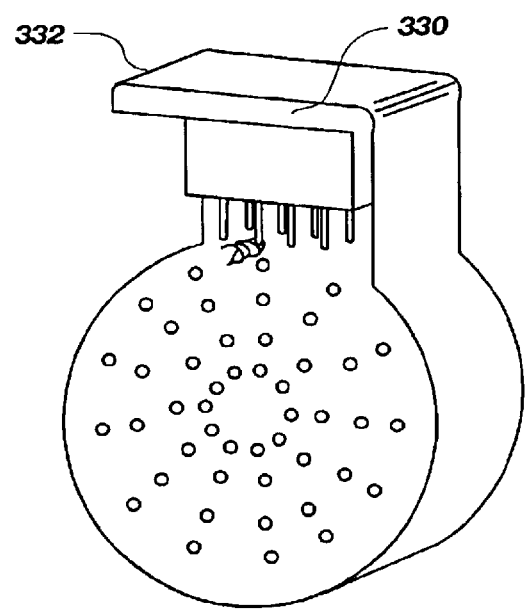
FIG. 7 is a perspective view of a transmission system that is part of the in-situ FDR cable testing system connector of FIG. 6.

FIG. 7 is provided as a perspective view of the transmission system 330 that is used in the in-situ FDR cable testing system 320. The transmission system 330 shown in this embodiment requires an antenna 332 when operating as a wireless transmission system. The wireless transmission system 330 is preferred in order to eliminate the need for even more wiring in the structure where the cables are being tested. This is just more wiring that can fail, and the number of in-situ FDR cable testing systems 320 that may be needed would make retrofitting a much more costly endeavor.

Figure 8:
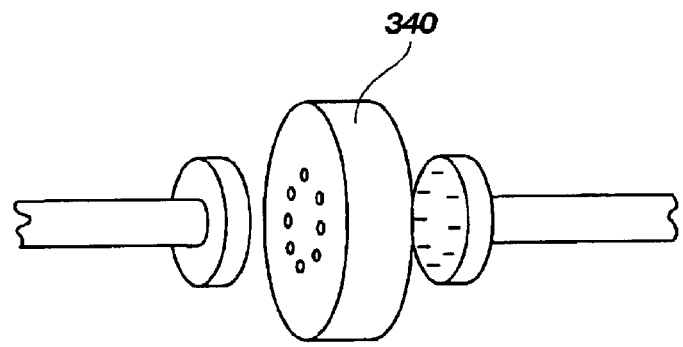
FIG. 8 is an alternative embodiment of an in-situ FDR cable testing system.

In an alternative embodiment shown in FIG. 8, a "hockey-puck" design 340 for an in-situ FDR cable testing system includes all of the components shown in FIG. 7. This hockey-puck design 340 would be used where cables being tested are not as tightly confined, and it could be disposed at places along a cable length other than at a junction box.

Figure 9:
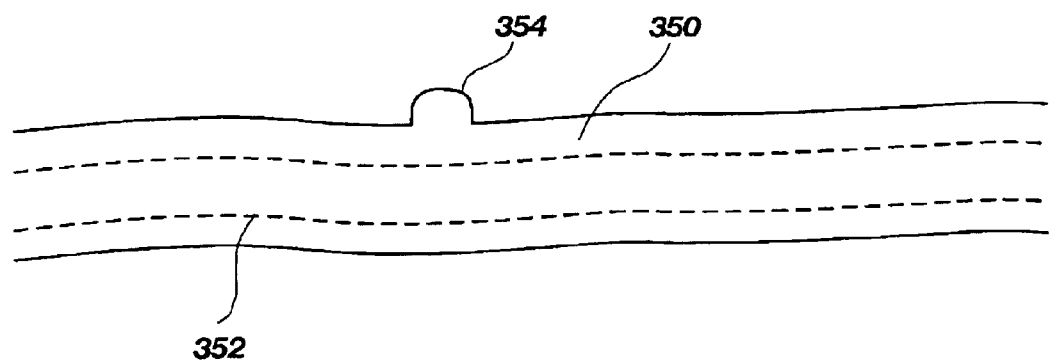
FIG. 9 is another alternative embodiment of an in-situ FDR cable testing system.

An alternative to the first or second embodiments shown above is a "smart cable" in-situ FDR cable testing system. FIG. 9 shows that the insulation 350 around a cable 352 could include the cable testing system. It is believed that the in-situ cable testing system could be constructed as the size of a pea, and could therefore be integrated into the insulation material.

In another alternative embodiment, the insulation itself could function as the in-situ FDR cable testing system. For example, there are many materials that could be used that are temperature sensitive, strain sensitive, etc. Using these materials as the cable insulation can generate data. Another option is to dispose a sensing cable around the outside of the main cable so as to form a continuous coil. If the sensing cable becomes frayed or an open circuit, it is a warning that there may be a problem with the cable that it is wrapped around. The system may be passive or active, and coupled to some alarm system through a wired or wireless connection.

What is important is that the FDR cable testing system be disposed in-situ. This would be best accomplished by manufacturing or installing the FDR cable system at the time that the structure is being built. However, the present invention also envisions retrofitting any existing cabling, on a large or small scale. In this way, complex or simple cabling can be tested at the press of a button. Most advantageously, cable faults can be located to within a few centimeters before they even cause failures.

The in-situ FDR cable testing system of the present invention provides both active and passive methods of cable fault detection. Passive sensing is critical when testing live cables that might be carrying power or digital signals. This is because if the FDR cable testing system were to fail, it could possibly prevent the cable being tested from functioning, depending upon the type of connection that is made to the cable. Thus, it is important to be able to perform at least some cable testing operations without the possibility of causing cable failure should the testing system itself fail.

Passive connectivity systems of the present invention include an inductive connection, capacitive connection, and a cross talk connection which is just another form of a capacitive connection. The capacitive connection method operates well, while the inductive connection is difficult to analyze, and the cross talk connection is not likely to function as well, but it may be possible to overcome the initial difficulties.

It is also noted that a passive connectivity connection will also work for the other sensing technologies of SWR and TDR, though it has not been seen in the prior art.

Figure 10:
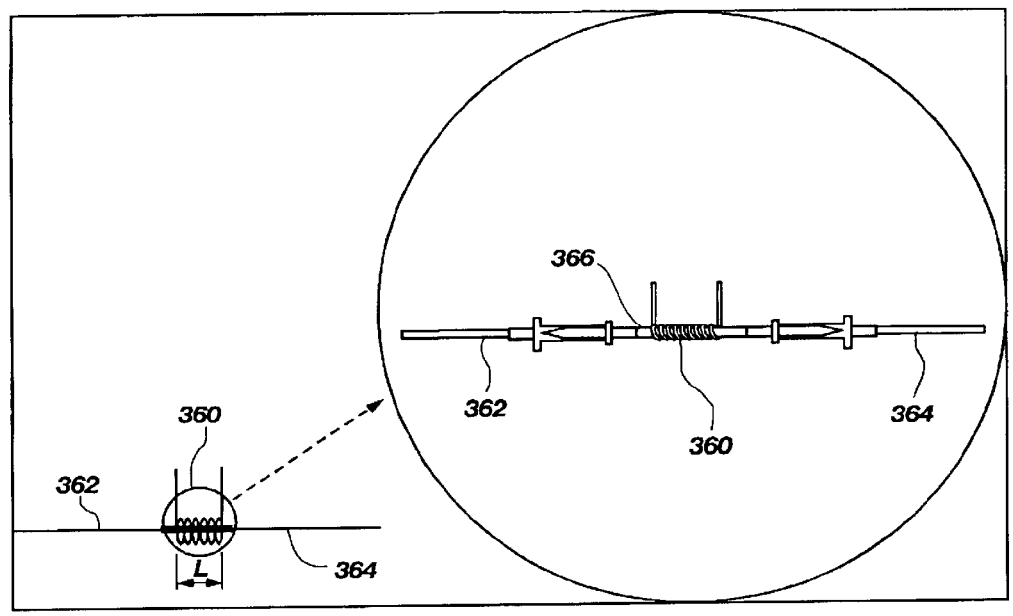
FIG. 10 is a general and close-up view of a passive FDR cable testing apparatus using inductive coupling.

FIG. 10 is an illustration of an inductive coupler 360. A first wire 362 is joined to a second wire 364 via some connection device. In this illustration, the inductive coupler 360 is wrapped around the connection device, a magnetic material 366. The inductive coupler 360 is then coupled to the FDR cable testing system via the two wires that come from the windings around the magnetic material 366. Because this system is passive, the FDR cable testing system operates as described earlier, without having to compensate for power or signal that might be on the cable being tested.

Figure 11:
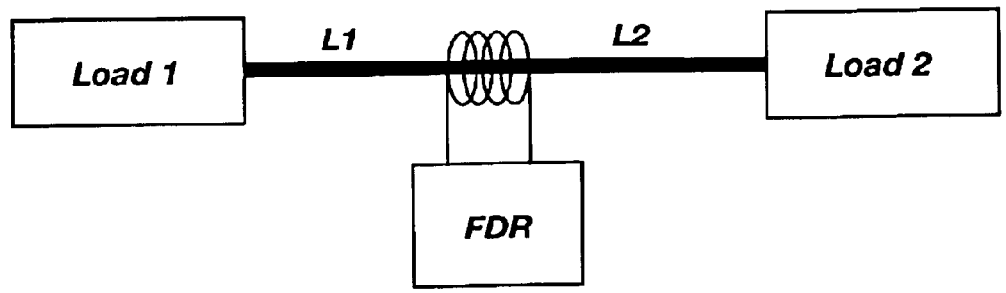
FIG. 11 is another view of passive cable testing system shown in FIG. 10.

FIG. 11 is provided to illustrate that it is assumed that there are some loads coupled to the system of FIG. 10. These loads are shown as load 1 and load 2 in FIG. 11.

Any method of integrating an FDR cable testing system with a cable without disrupting the cable will most likely be disposed near the center of the cable. This configuration means that the system will effectively test the cable in both directions. Another way to consider this situation is as if the FDR cable testing system simultaneously sees two cables. This aspect of the invention requires careful analysis of the returned results, as the effects from both cables are superimposed.

Advantageously, the inductive method above may be adapted for use from a hand-held device that "clamps" around existing (unshielded) cables. A similar method with similar technical challenges is to use side-by-side coupled microstriplines, through which the signal cable extends. While the ability to transfer power to and from the wire using inductive loops is well understood, the signal processing that is required to determine cable length and load from the very small return signal is likely to be complex. It is clear from signals previously obtained that a measurable change is observed. This change is the sum of two reflections from the cable, a forward coupling term down one portion of the cable, and a reverse coupling term from the other portion, depending upon which way the wire is wound around the cable. The forward coupling has a derivative behavior, and the reverse coupling term has a non-derivative behavior. The summation of these two terms (both of which are small), also depends on the number of terms in the wire wrapped around the cable, and how that wire is attached to the FDR unit itself.

Furthermore, a mismatch between this wrapping wire and the FDR cable testing system needs to be addressed. Either an impedance matching network such as an inductive balun needs to be developed, or signal processing methods for this highly mismatched connection need to be used.

It is anticipated that the signal processing solution will be superior, as minimizing hardware in this application is of paramount importance because of weight and size limitations.

Figure 12:
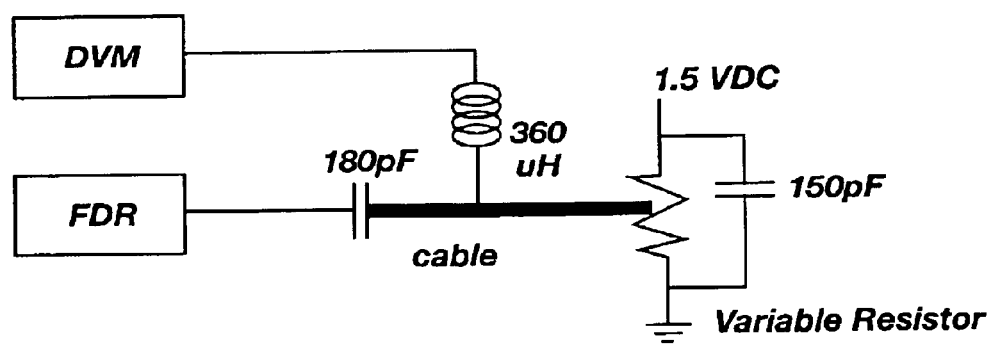
FIG. 12 is a block diagram of a passive FDR cable testing system apparatus using capacitive coupling.

FIG. 12 is another option for providing passive connectivity that utilizes capacitive coupling. Capacitors are used to decouple the FDR cable testing system from the low frequency (or DC) signal on the cable being tested. This method has been demonstrated to be effective for coupling the FDR cable testing system to DC power lines, enabling use of the FDR cable testing system without interference from noise on the power line, and without interfering with the power distribution system from the FDR cable testing system.

The issue of noise in this type of capacitive coupling connection will remain the topic of investigation, as aircraft encounter extremely noisy and hostile environments, and the system must function properly in spite of this. Accordingly, inductive coupling appears to work best.

It has been stated that there are many types of faults that can occur in cabling, but some types of faults are easier to detect than others using the FDR cable testing system of the present invention. Opens and shorts in cables are relatively easy to detect, while cracked insulation, pinholes, compromised electromagnetic shields, improper grounding, cold or broken solder joints, incorrect reassembly during maintenance of cable connectors and cable fray or chafing of cable insulation are much more difficult to detect.

Cable fray in particular is a growing concern in industry and to the military. Consider aging aircraft fleets. In a typical commercial aircraft, there may be miles of cable and wire to supply critical information to the onboard computers to ensure the flight safety of the passengers and pilots. These wires are subject to severe conditions of varying temperature, enormous amounts of vibration, and human handling problems from maintenance personnel. These conditions cause the insulation of the wire to crack and expose the bare wire inside. These chafes and frays in the wire can range from hairline cracks to exposed areas of the wire that are several centimeters long. This represents a dangerous situation to the aircraft when these wires are near flammable materials and could possibly short to ground, creating a spark from the exposed wire.

A wire in good condition will generally hold fairly constant impedance down the length of the wire, and thus provide little or no reflection. Frayed wire can change the wire's impedance slightly but generally not enough to visually detect problems in the wire. Adding junctions in the wires further complicates reflections. These connections cause reflections to occur in the wire as well and can make the reflected wave difficult if not impossible to process when trying to detect problems.

In an FDR cable testing system, sine waves are sent down a cable at different frequencies, and the reflected waves are examined. As the length of the cable under test is shortened or lengthened, the standing wave frequency is changed. This change can then be examined by looking at the FFT of the reflected wave. When the frequency changes, a spike is generated in the frequency domain corresponding to the frequency of the reflected signal. This spike is then taken as a baseline. When the cable is shortened or lengthened, the spike representing the frequency of the reflected signal is moved. Based on the distance of this movement a relationship can be made as to the length of the cable. If this spike is moved significantly then the length of the cable under test has also changed, giving an indication of the length of the cable and how it correlates to the frequency of the reflected wave.

Figure 13:
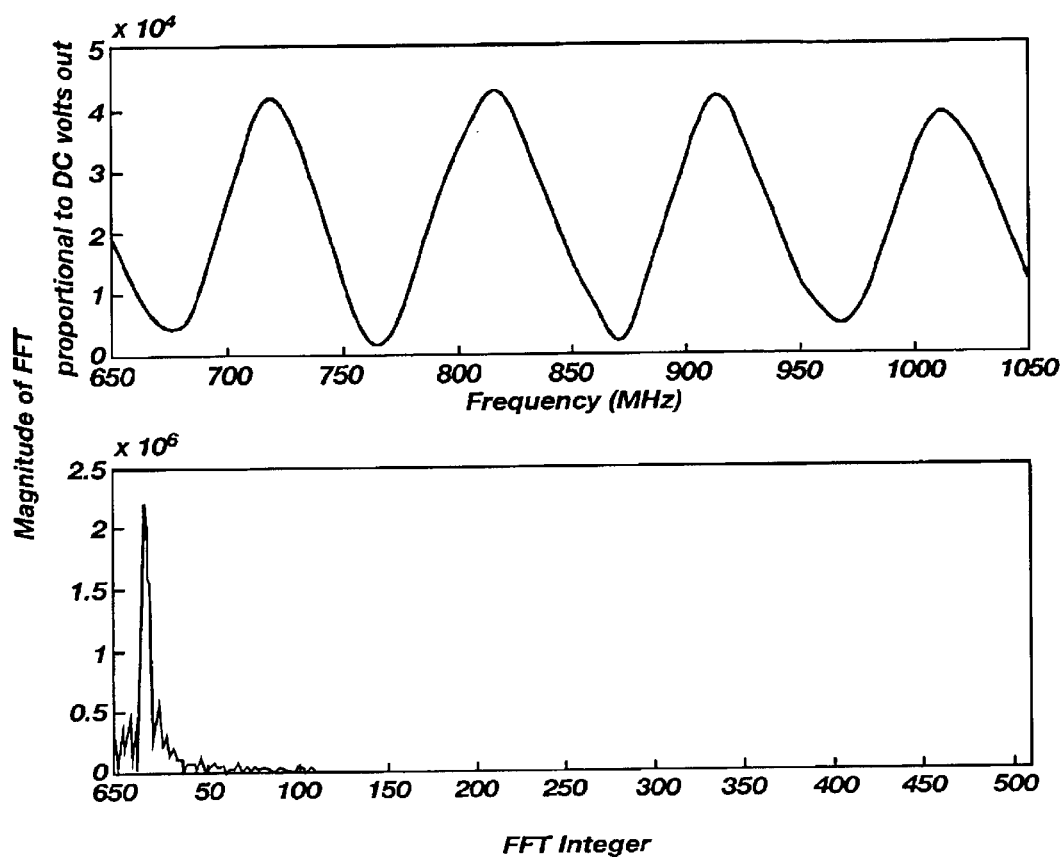
FIG. 13 is two graphs of a peak in the frequency domain, the first graph as a function of frequency, and the second graph as an FFT Integer.

By testing various cables and their frequency signatures, an adaptive test solution can be made to find opens or shorts in wires and cables. This system is very valuable, because as explained previously, an FDR circuit can be made inexpensively compared to a TDR circuit, which would require a sharp rise time pulse to send down the wire. Shown in FIG. 13 is an example plot of the peak in the frequency domain from a coaxial cable of 62 cm.

Looking at the time domain signal of a good and frayed shielded twisted-pair wire would show a difference where the fray occurs as a small bump in the time domain signature. In the frequency domain, this bump will be represented by different frequencies in the FFT. If hardware such as an FDR cable testing system is used to test frayed wire, it should produce a signature similar to the portion of the FFT where the FDR is operating. Based on this, it was envisioned that it is possible to find problems on the wire using frequency domain methods, and it may also be possible to find the actual size of the fray based on the FFT information. Unfortunately the FFT analysis can be quite complex.

Figure 14:
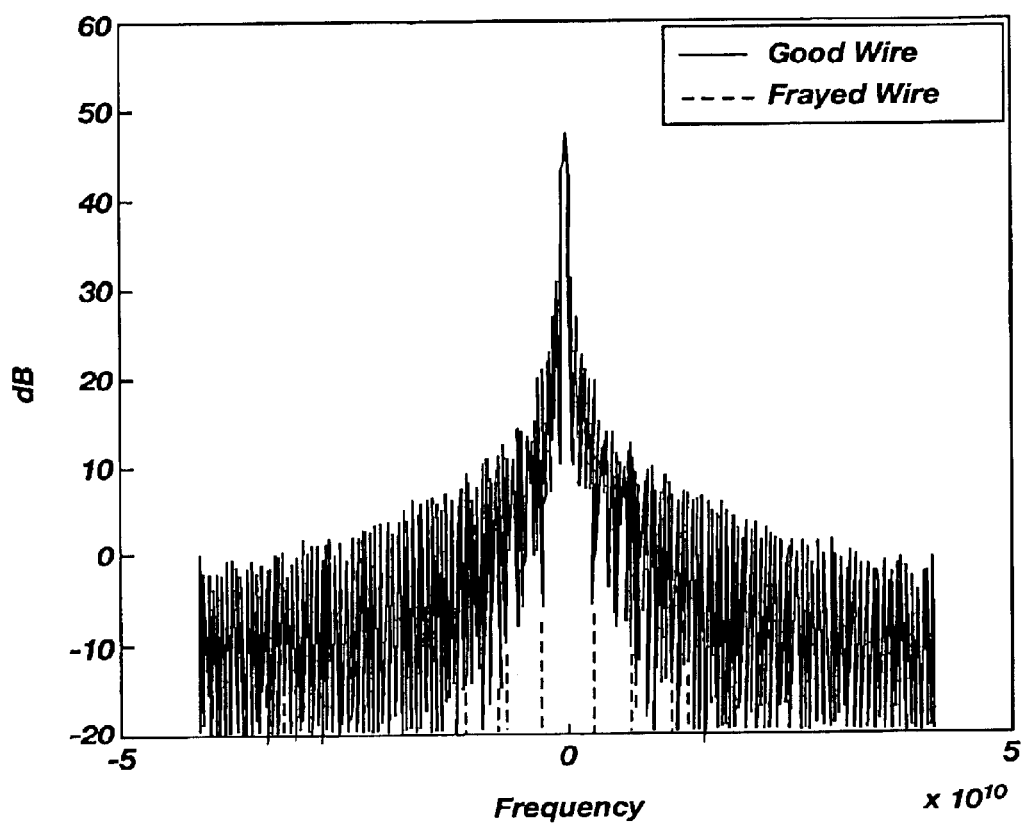
FIG. 14 is a graph of the entire spectrum of a cable being tested using an FDR cable testing system.

Shown in FIG. 14 is the FFT of the entire spectrum of a cable being tested. A good wire and a frayed wire are plotted together to show that they look almost exactly the same. This figure also how the FFT plots are even more complicated and difficult to visibly discern differences than in time domain plots. However, using the technique of comparing differences, we can find small changes from one wire to the other. To find changes, differences are taken in the frequency domain similar to the time domain tests. Taking a baseline average into the frequency domain with the FFT and using that as a template to compare against the frayed wire makes the frayed wire become more visible.

Figure 15:
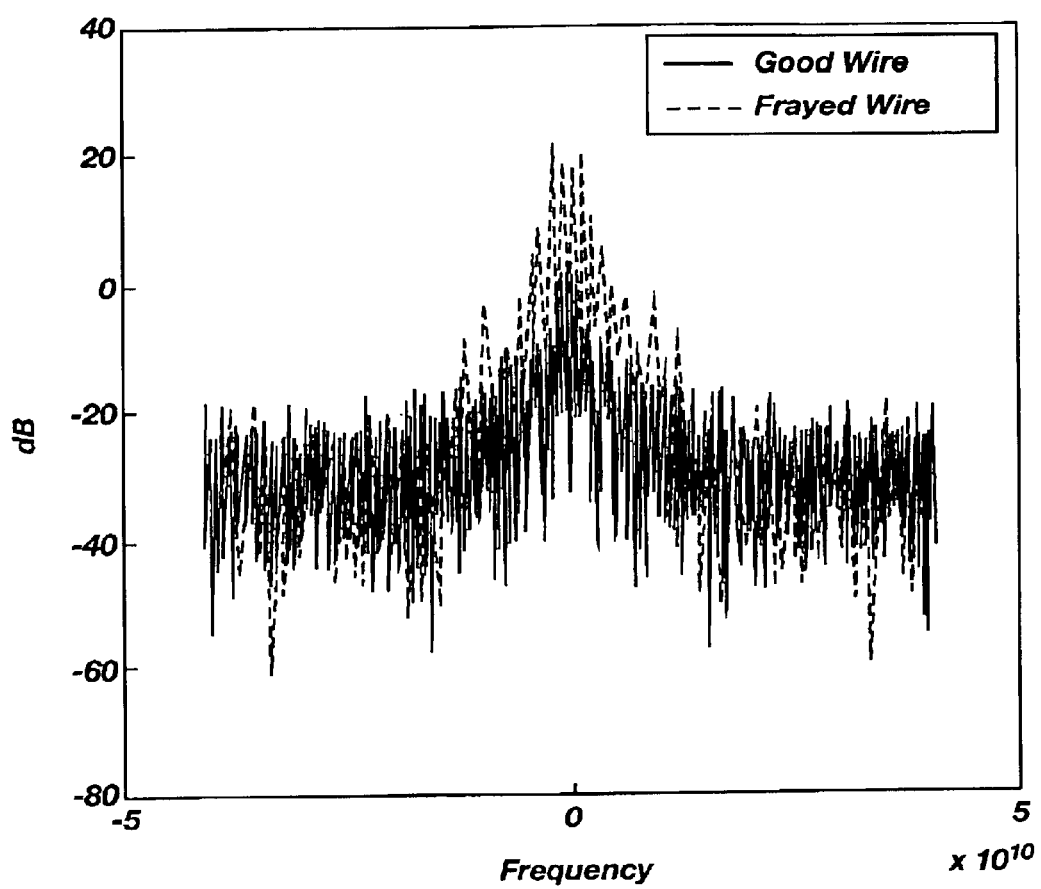
FIG. 15 is a graph of the FFT of the good wire subtracted from the baseline, and the FFT of the frayed wire subtracted from the same baseline.

FIG. 15 is a plot of the FFT of the good wire subtracted from the baseline, and the FFT of the frayed wire subtracted from the same baseline. These subtractions were done in the frequency domain and are used to determine if changes have happened to the wire. Ideally a change that occurs in the time domain will also occur in the frequency domain. This should be the case because the time domain signal and the frequency domain signal are of the same data set and contain the same information. The only difference is the way the data is examined. By changing to the frequency domain a different perspective is achieved that appears to reveal useful and different information.

Figure 16:
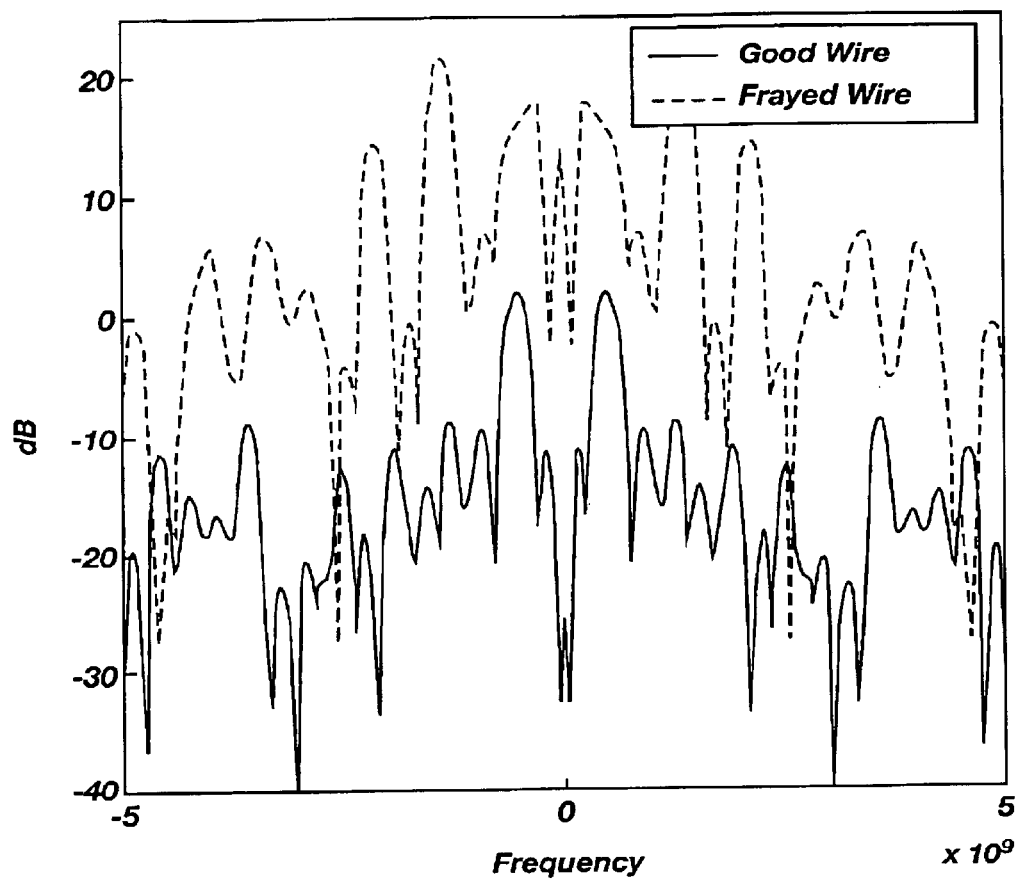
FIG. 16 is a graph of only the lower frequencies shown in FIG. 15 that demonstrates the difference in the good and frayed cable using FDR.

It is easily seen from FIG. 16 that in the lower frequencies, the amplitude of the differences of the frayed wire are higher. This difference taken in the frequency domain makes it easier to see the lower frequencies that appear from the frayed wire. Zooming in on these frequencies, it is possible to visibly observe a difference. FIG. 16 shows the expanded view of FIG. 15.

As shown in FIG. 16 the lower frequencies represent a greater difference between the wires. This is helpful because the lower frequencies are easier to create to send down the cable than extremely high frequencies. Low frequencies are easier to create because hardware for creating these types of signals is readily available and inexpensive for FDR. High frequencies are difficult to create because the hardware for them is difficult to build. In the higher frequencies the impedance matching of all the circuits becomes more difficult. This makes the hardware to create these signals more expensive and difficult to purchase.

It is not immediately clear if high or low frequencies would produce a better return for detecting frays. Lower frequencies have the advantage that they can propagate further down the cable without loss and therefore subject the fray to a higher power. The higher frequencies have the advantage that the size of the fray is large compared to wavelength and could therefore be more easily detected. Only experiments such as this one can clearly predict the optimal frequency set for cable fray detection and location.

It was previously predicted that a frequency span of 200 to 400 MHz was the ideal frequency for predicting frays. This information was achieved by testing various lengths of shielded twisted-pair wire with different types of frays. If a frequency span of 200 MHz to 400 MHz is an optimal solution for the shielded twisted-pair wire that was tested, perhaps an optimal frequency span can be found for all types of wire and different types of cable frays. As shown in FIG. 15, it appears that lower frequencies do show a difference from the baseline with this type of shielded twisted-pair wire and fray.

Despite the fact that a visual difference was able to be detected rather easily, this may not be the situation in all cases. Thus, an important aspect of the invention is to detect cable fray when waveforms have many discontinuities. In other words, a visual inspection of the two superimposed waveforms may not reveal the desired information. Accordingly, another aspect of the invention is to utilize some sort of mathematical analysis to detect differences, when visual clues are not as straightforward. In the present invention, Monte Carlo integration is performed in order to perform the desired analysis.

Figure 17:
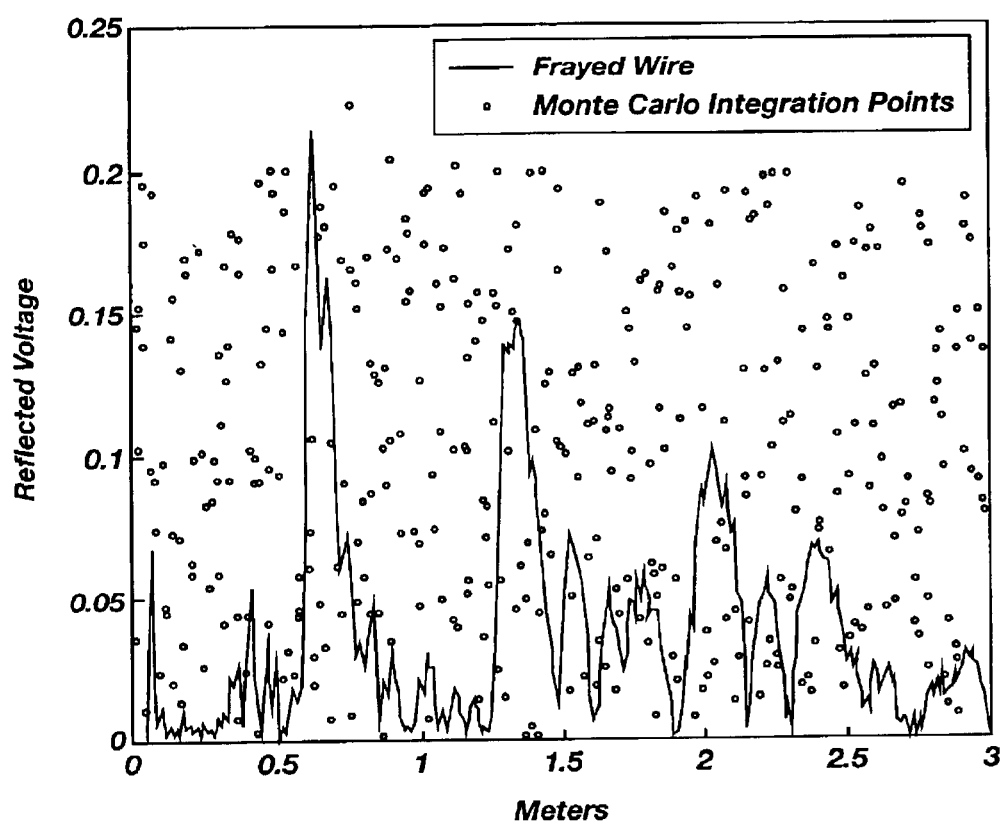
FIG. 17 is a difference plot of cable fray with Monte Carlo integration points disposed thereon.
Figure 18:
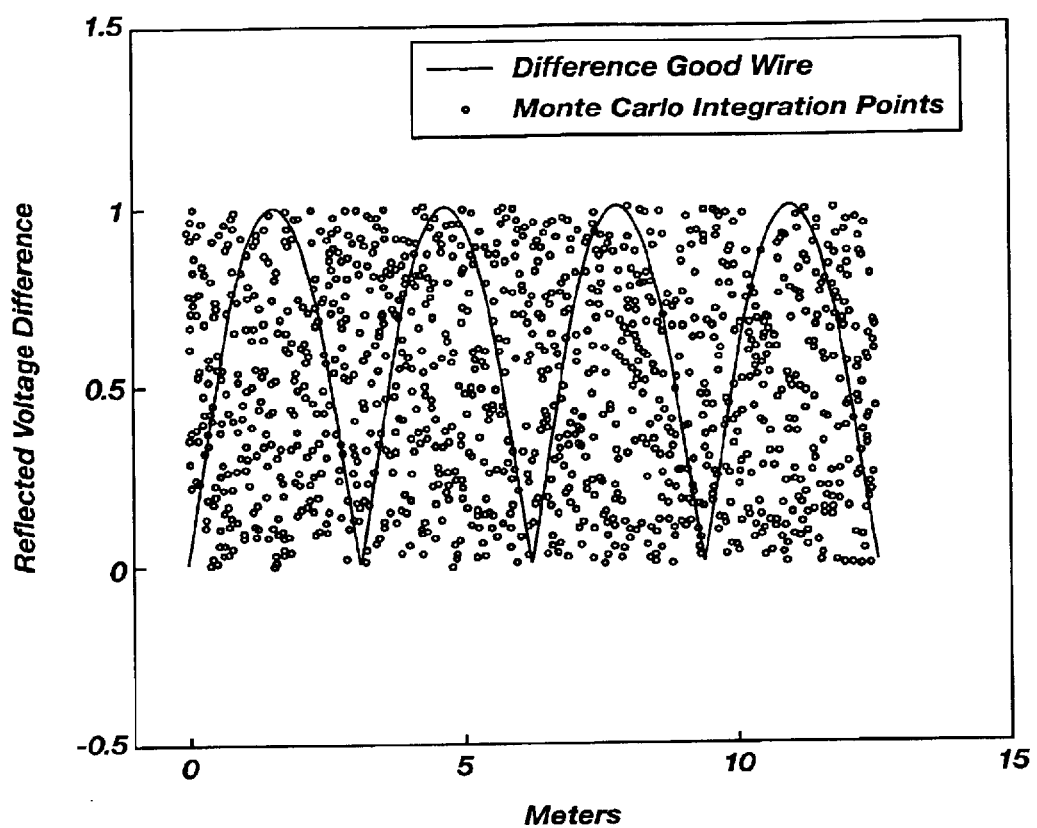
FIG. 18 is a simpler example of a waveform and Monte Carlo integration points.

Other techniques that could be used with less success would be a midpoint integration or trapezoidal integration. These integration techniques would have a disadvantage over the Monte Carlo because it would be hard to form rectangles or trapezoids from the spikes on the difference plot. Monte Carlo places a box around the function to be integrated and then places random numbers in the box. The more random numbers there are, the more accuracy is achieved. These random numbers are then counted if they are above the function and then multiplied by the area of the box. FIG. 17 shows a difference with random numbers generated throughout the plot to integrate the waveform. FIG. 18 shows a simpler example of the Monte Carlo integration points using an absolute sine wave.

The points are used to integrate the wave. The integration works surprisingly well considering the random nature of this technique. To overcome some of the randomness, the waveform is integrated a number of time. The present invention performed the integration six times, and an average is taken to obtain a good result. This number should not be considered a limiting factor, and the number of integrations can be modified for the particular situation. The Monte Carlo integration can be used to test a wire and determine if the wire has changed, and how dramatic a change it has undergone. Monte Carlo integration is quick because it is being used to determine if a change has occurred, and is not being used to determine the exact value of the integral.

Because the Monte Carlo integration technique uses random numbers, and the measurements that are taken can change slightly from measurement to measurement, an average is taken to limit these changes and provide better data. By integrating these differences, a direct, comprehensive comparison can be made from a good wire to a wire with a fray. The integrated result of the difference between the frayed wire and the baseline is much larger than the integrated result of the difference between the good wire and the baseline. This is to be expected because of the large difference that occurred at the fray on the wire.

If a cable has a large error measurement, as in a single-strand cable that is moved around, then the results from the integral need to be higher than the error measurements in order to be detected. Integrated differences are also a function of the size of the fray or frays. Large frays yield larger results, because the difference from the baseline would be greater. Small frays yield small results and need to be compared to error measurements for that particular cable.

The last type of cable fault that will be discussed is one that is difficult to track down. This difficulty may arise because it only occurs in the operating environment because environmental conditions change, and is referred to as a ticking fault. Thus, the cable testing system must also be capable of operating on lives cables. It has previously been disclosed that the problems involved with adding an FDR signal to a live wire, and then trying to look at the resulting reflections, are many.

Accordingly, one aspect of the invention is to utilize spread spectrum techniques to perform cable testing. In other words, the high frequency signal of the FDR system could be reduced so that it is down enough into the noise so that it won't interfere with the signals of the particular system being tested which is live, and vice versa. Thus, a single frequency will not serve to jam the FDR cable testing system.

To understand how spread spectrum will be implemented, some background information is useful. It is observed that Direct Sequence Spread Spectrum (DSSS) is a common method used to improve performance of wireless communication devices. A pseudo-random noise code (PN code) is multiplied by the original digital data signal that is to be transmitted. The result is a newer and higher bandwidth data signal. This higher bandwidth data signal is transmitted via wireless link using methods like BPSK, QPSK, etc. as is known to those skilled in the art. The advantages of this type of transmission include efficient use of bandwidth, noise immunity, resistance to jamming, etc.

The present invention applies the DSSS transmission concept to impedance sensing in order to test cables. As explained above, the length of wires can be determined using reflectometry by measuring impedance in FDR. In the present invention, the resulting data signal is now multiplied by a PN code to spread the original data signal and make it small, or comparable to noise. The original signal can be gathered or collected using correlation of the PN code, and the "channel" (in this case the wire under test or any other sensor of which the impedance is being measured) can be determined from the propagation delay measured via the PN code.

Two related methods of utilizing DSSS to perform impedance measurements are Frequency Hopped Spread Spectrum (FHSS) and Zero Coding, as those terms are understood by those skilled in the art.

The present invention may also have other sensing applications. These sensing applications are where impedance measurements are performed when environmental noise or other signals are present on test wires, sensors, etc. For example, these sensing applications include testing for soil moisture, water level, fluid discrimination, proximity sensing, etc. The invention may also provide a more robust measurement.

It is also important to recognize that while the example of the aviation industry has been used to demonstrate the need for the present invention, it is certainly not the only industry that is seeking for a system that can provide quick, accurate and inexpensive cable testing technology. These other industries include the entire communications industry, the computer network industry, the automotive industry, the medical device industry, the home and commercial maintenance and building industry, the ship building and maintenance industry, the train industry, the space industry, the industrial building industry, and the nuclear industry, to name but a few specific but very large entities that can benefit from the present invention.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A method for determining integrity of a cable under test utilizing a cable testing system that uses frequency domain reflectometry (FDR), said method comprising the steps of:
   (1) coupling the FDR cable testing system to a connecting end of the cable under test;
   (2) transmitting at least one input signal from the FDR cable testing system to the cable under test, and to a mixer;
   (3) receiving a reflected input signal from the cable under test;
   (4) mixing the at least one input signal and the reflected input signal in the mixer to thereby generate a DC signal; and
   (5) processing the DC signal to thereby obtain data regarding integrity of the cable under test.

2. The method as defined in claim 1 wherein the step of obtaining data regarding integrity of the cable under test further comprises the step of determining impedance of the cable under test at a point of termination thereof.

3. The method as defined in claim 2 wherein the method further comprises the steps of:
   (1) determining if the cable under test has a short circuit at the point of termination, wherein a short circuit is indicated by a small impedance value at the point of termination; and
   (2) determining if the cable under test has an open circuit at the point of termination, wherein an open circuit is indicated by a large impedance value at the point of termination.

4. The method as defined in claim 3 wherein the method further comprises the step of determining a length of the cable under test from the connecting end to the point of termination.

5. The method as defined in claim 4 wherein the method of determining a length of the cable under test further comprises the step of mixing the at least one input signal and the reflected input signal in the mixer to thereby generate a mixed signal having at least three components.

6. The method as defined in claim 5 wherein the method further comprises the steps of:
   (1) generating the sum of the at least one input signal and the reflected input signal;
   (2) generating the difference of the at least one input signal and the reflected input signal; and (3) generating the at least one input signal, wherein the three components form the mixed signal.

7. The method as defined in claim 6 wherein the method further comprises the step of filtering out high frequency components from the mixed signal.

8. The method as defined in claim 7 wherein the method further comprises the steps of:
   (1) dropping the sum of the at least one input signal and the reflected input signal;
   (2) dropping the at least one input signal; and
   (3) converting the difference of the at least one input signal and the reflected input signal which is an analog direct current (DC) voltage signal to a digital signal.

9. The method as defined in claim 8 wherein the method further comprises the steps of:
   (1) generating a plurality of input signals, wherein the plurality of input signals are utilized to generate a plurality of digital signals;
   (2) storing the plurality of digital signals in an array, wherein a frequency of each of the plurality of input signals is associated with a corresponding digital signal that is generated thereby;
   (3) performing a Fast Fourier Transform (FFT) on each of the plurality of digital signals to thereby generate a plurality of Fourier signals, one for each of the plurality of digital signals, and wherein each of the plurality of Fourier signals has a given magnitude;
   (4) determining which of the plurality of Fourier signals has a greatest magnitude; and
   (5) translating the Fourier signal having the greatest magnitude to a distance along the cable under test relative to the connecting end, thereby determining a length of the cable under test to the point of termination.

10. The method as defined in claim 9 wherein the method further comprises the step of calculating the length of the cable under test utilizing the equation $$L = \frac{uN}{2f_{BW}},$$

wherein L is the length of the cable under test to the point of termination, wherein u is the velocity of propagation of the input signal in the cable under test, wherein N is the number of cycles in the digital signal, and wherein $f_{BW}$ is the bandwidth in Hertz of a sampling range.

11. The method as defined in claim 10 wherein the step of determining impedance of the cable under test at the point of termination further comprises the step of solving the equations $$Z_{in} = Z_0 \frac{(p+1)}{(p-1)} \text{ and, } Z_L = Z_0 \frac{(Z_{in} - jZ_0 \tan\beta l)}{(Z_0 - jZ_{in} \tan\beta l)}$$

to thereby determine an input impedance of the cable under test, wherein $Z_L$ is the input impedance of the cable under test, p is the complex reflection coefficient of the cable under, $Z_0$ the impedance at the point of termination of the cable under test, l is the length of the cable under test, and $Z_L$ is the impedance of the termination of the cable under test.

12. The method as defined in claim 11 wherein the step of transmitting the at least one input signal from the FDR cable testing system to the cable under test further comprises the steps of:
   (1) providing a personal computer, wherein the personal computer generates a command signal containing a predetermined frequency for a sine wave; and
   (2) providing a voltage controlled oscillator (VCO), wherein the VCO receives the command signal and generates the sine wave of the predetermined frequency value to thereby produce the input signal.

13. The method as defined in claim 12 wherein the method further comprises the steps of:
   (1) providing a power divider, wherein the power divider splits the input signal;
   (2) providing a mixer, wherein the mixer receives the input signal that is split by the power divider; and
   (3) providing the cable under test, wherein the cable under test also receives the input signal that is split by the power divider.

14. The method as defined in claim 13 wherein the method further comprises the steps of:
   (1) transmitting the reflected input signal from the point of termination of the cable under test to a directional coupler;
   (2) transmitting the reflected input signal from the directional coupler to an amplifier; and
   (3) amplifying the reflected input signal to thereby have a magnitude that is approximately the same as the input signal that was transmitted to the mixer.

15. The method as defined in claim 14 wherein the method further comprises the steps of:
   (1) mixing the input signal received from the power divider and the reflected and amplified input signal received from the amplifier; and
   (2) generating the mixed signal as defined in claim 6.

16. The method as defined in claim 15 wherein the method further comprises the steps of:
   (1) filtering high frequency components from the mixed signal;
   (2) digitizing the analog mixed signal; and
   (3) transmitting the digitized signal to the personal computer for storage in the array of claim 9.

17. The method as defined in claim 16 wherein the method further comprises the steps of:
   (1) generating the command signal that contains the first frequency for the VCO to generate;
   (2) receiving the digital signal from the A/D converter;
   (3) adding a stepped input frequency to a previous frequency transmitted to the VCO to generate a new frequency for the VCO to generate;
   (4) transmitting the new frequency to the VCO in a new command signal; and
   (5) repeating steps (2) through (4) until the new frequency is equal to or greater than a predetermined stop frequency.

18. The method as defined in claim 17 wherein the method further comprises the step of utilizing the personal computer to analyze the array after the stop frequency is reached in order to determine the length of the cable under test, and an impedance of the cable under test, to thereby determine if the cable under test ends in a short circuit or an open circuit.

19. The method as defined in claim 8 wherein the method further comprises the steps of:
   (1) generating a plurality of input signals, wherein the plurality of input signals are utilized to generate a plurality of digital signals;
   (2) storing the plurality of digital signals in an array, wherein a frequency of each of the plurality of input signals is associated with a corresponding digital signal that is generated thereby;

(3) performing a transformation on each of the plurality of digital signals to thereby obtain data from which can be determined a distance along the cable under test relative to the connecting end, thereby determining a length of the cable under test to the point of termination.

20. The method as defined in claim 19 wherein the step of performing a transformation further comprises selecting the transformation from the group of transformations comprised of Discrete Fourier Transform, Two Equations—Two Unknowns method, N-Equations N-Uknowns, Interpolation and FFT, Interspersing Zero Points and Low Pass Filtering, Acceleration of Data Signal, Zero Crossing of Signals, and Mathematical Modeling.

21. A cable testing system that utilizes principles of frequency domain ref lectometry (FDR) to thereby determine characteristics of a cable under test (CUT), said cable testing system comprising:

a voltage controlled oscillator (VCO) for generating an input signal;

a power divider for receiving the input signal from the VCO and dividing the input signal into at least two signals;

a mixer for receiving the divided input signal from the power divider;

wherein the CUT also receives the divided input signal from the power divider, and generates a reflected input signal, and wherein the mixer receives the divided input signal from the power divider and the reflected input signal from the CUT to thereby generate a mixed signal having at least two components;

an analog to digital (A/D) converter for receiving the mixed signal and filtering out high frequency components therefrom, and for generating a digital signal, wherein the digital signal contains a signal that is dependent upon a frequency of the input signal, a length of the CUT, and of a point of termination of the CUT; and a processor for utilizing the digital signal to thereby determine characteristics of the cable under test.

22. The cable testing system as defined in claim 21 wherein the cable testing system further comprises a computer, wherein the computer controls the VCO and performs calculations to thereby determine the characteristics of the cable under test.

23. The cable testing system as defined in claim 22 wherein the cable testing system further comprises:

a directional coupler for receiving the reflected input signal from the CUT; and an amplifier for receiving the reflected input signal from the directional coupler and amplifying the reflected input signal, wherein the amplifier transmits the reflected input signal to the mixer.

24. A method for determining characteristics of a cable under test utilizing a cable testing system that uses principles of frequency domain reflectometry (FDR), said method comprising the steps of:

(1) providing a signal generator for generating a sine wave, a power divider coupled to the signal generator at an input, and to a mixer and the cable under test at two outputs, wherein the mixer is also coupled at another input to the cable under test for receiving a reflected sine wave therefrom, and at an output to an input of an analog to digital (AID) converter, wherein the A/D converter is coupled at an output to a processor;

(2) transmitting a sine wave from the signal generator to the cable under test and to the mixer via the power divider;

(3) receiving a reflected sine wave from the cable under test at the mixer;

(4) mixing the sine wave and the reflected sine wave to generate a DC signal from the mixer;

(5) processing the DC signal to thereby obtain data regarding impedance and length of the cable under test;

(6) changing a frequency of the sine wave;

(7) performing steps (2) through (6) a predetermined number of times to thereby generated a plurality of DC signals; and (8) determining impedance and length of the cable under test utilizing the plurality of DC signals.

25. The method as defined in claim 24 wherein the method further comprises the step of mixing the sine wave and the reflected sine wave to thereby generate a mixed signal having at least two components.

26. The method as defined in claim 25 wherein the method further comprises the steps of:

(1) generating the sum of the sine wave and the reflected sine wave;

(2) generating the difference of the sine wave and the reflected sine wave; and (3) generating the sine wave, wherein the sum, different and original sine wave for three components of the mixed signal.

27. The method as defined in claim 26 wherein the method further comprises the step of filtering out high frequency components from the mixed signal.

28. The method as defined in claim 27 wherein the method further comprises the steps of:

(1) dropping the sum of the sine wave and the reflected sine wave;

(2) dropping the at least one input signal; and (3) converting the difference of the sine wave and the reflected sine wave, which is an analog direct current (DC) voltage signal, to a digital signal, wherein a plurality of digital signals are generated by the plurality of sine waves.

29. The method as defined in claim 28 wherein the step of determining impedance and length of the cable under test further comprises the step of determining impedance of the cable under test at a point of termination thereof.

30. The method as defined in claim 29 wherein the method further comprises the steps of:

(1) determining if the cable under test has a short circuit at the point of termination, wherein a short circuit is indicated by a small impedance value at the point of termination; and (2) determining if the cable under test has an open circuit at the point of termination, wherein an open circuit is indicated by a large impedance value at the point of termination.

31. The method as defined in claim 30 wherein the method further comprises the steps of:

(1) storing the plurality of digital signals in an array, wherein a frequency of each of the plurality of sine waves is associated with a corresponding digital signal that is generated thereby;

(2) performing a Fast Fourier Transform (FFT) on each of the plurality of digital signals to thereby generate a plurality of Fourier signals, one for each of the plurality of digital signals, and wherein each of the plurality of Fourier signals has a given magnitude;

(3) determining which of the plurality of Fourier signals has a greatest magnitude; and (4) translating the Fourier signal having the greatest magnitude to a distance along the cable under test, thereby determining a length of the cable under test to the point of termination.

32. The method as defined in claim 31 wherein the method further comprises the step of calculating the length of the cable under test utilizing the equation $$L = \frac{uN}{2f_{BW}},$$

wherein L is the length of the cable under test to the point of termination, wherein u is the velocity of propagation of the input signal in the cable under test, wherein N is the number of cycles in the digital signal, and wherein $f_{BW}$ is the bandwidth in Hertz of a sampling range.

33. The method as defined in claim 32 wherein the step of determining impedance of the cable under test at the point of termination further comprises the step of solving the equations $$Z_{in} = Z_0 \frac{(p+1)}{(p-1)} \text{ and, } Z_L = Z_0 \frac{(Z_{in} - jZ_0 \tan\beta l)}{(Z_0 - jZ_{in} \tan\beta l)}$$

to thereby determine an input impedance of the cable under test, wherein $Z_L$ is the input impedance of the cable under test, p is the complex reflection coefficient of the cable under test, $Z_0$ is the impedance at the point of termination of the cable under test, l is the length of the cable under test, and $Z_L$ is the impedance of the termination of the cable under test.

34. The method as defined in claim 33 wherein the method further comprises the steps of:

(1) providing a personal computer, wherein the personal computer generates a command signal containing a predetermined frequency for the sine wave; and (2) providing a voltage controlled oscillator (VCO) as the signal generator, wherein the VCO receives the command signal and generates the sine wave of the predetermined frequency value.

35. The method as defined in claim 34 wherein the method further comprises the steps of:

(1) transmitting the reflected sine wave from the point of termination of the cable under test to a directional coupler;

(2) transmitting the reflected sine wave from the directional coupler to an amplifier; and (3) amplifying the reflected sine wave to thereby have a magnitude that is approximately equal to that of the sine wave that was transmitted to the mixer.

36. The method as defined in claim 35 wherein the method further comprises the step of utilizing the personal computer to analyze the array after no more sine waves are being generated in order to determine the length of the cable under test, and an impedance of the cable under test, to thereby determine if the cable under test ends in a short circuit or an open circuit.

* * * * *